(12) United States Patent
Okita et al.

(10) Patent No.: US 6,669,498 B2
(45) Date of Patent: Dec. 30, 2003

(54) ZIF SOCKET

(75) Inventors: Masao Okita, Furukawa (JP); Min Huang, KunSan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/064,968

(22) Filed: Sep. 4, 2002

(65) Prior Publication Data

US 2003/0132018 A1 Jul. 17, 2003

(30) Foreign Application Priority Data

Jan. 11, 2002 (TW) ......................... 091200173

(51) Int. Cl.[7] ................................. H01R 4/50

(52) U.S. Cl. ....................... 439/342; 439/264

(58) Field of Search ............... 439/342, 264, 439/268

(56) References Cited

U.S. PATENT DOCUMENTS 6,116,936 A * 9/2000 Pei .............................. 439/342
2001/0018286 A1 * 8/2001 Mizumura ................... 439/342

* cited by examiner

Primary Examiner—Dean A. Reichard
Assistant Examiner—Jinhee J Lee
(74) Attorney, Agent, or Firm—Wei Te Chung

(57) ABSTRACT

A ZIF socket (1) includes a base (2) having a number of terminals (5) received therein, a movable cover (3), and a cam mechanism (4) assembled on the cover and the base. The cam mechanism includes a cam (41) and a base ring (42) attached to cam. The cam includes a driving section (411) engaging with the cover, a rotating section (412) engaging with the base, and a riveting section (413) extending from the rotating section. The riveting section has a bottom riveting surface (415) on a bottommost side and a V-shaped groove (416) defined in the bottom riveting surface. During riveting, the riveting section deforms more predictably under the riveting pressure, increasing the reliability of the riveted cam mechanism.

5 Claims, 6 Drawing Sheets

ZIF SOCKET

BACKGROUND OF INVENTION

1. Field of the Invention

The present invention relates to a ZIF socket, and particularly to a ZIF socket having an improved cam mechanism.

2. Description of Related Art

Referring to FIGS. 5 and 6, the conventionally ZIF socket 6 includes a rectangular-shaped base 7, a rectangular-shaped cover 8 movable on the base 7, and a cam mechanism 9 attached on the base 7 and the cover 8. The cam mechanism 9 comprises a cam 91 having a driving section 911 engaging with the cover 8, a rotating section 912 engaging with the base 7, and a riveting section 913 extending from a bottom side of the rotating section 912, and a base ring 92 assembled onto the riveting section 913 from a bottom thereof. In use, the riveting section 913 is riveted and abuts against the base ring 92 to securely assemble the cover 8 and the base 7 together. However, during riveting of the cam mechanism 9 to the base ring 92, occasionally, an uneven riveting force is exerted on the riveting section 913, which is easily deformed. If it is deformed toward a lateral side 914, it may destroy the steady rotation of the cam 91. Additionally, since the riveting force is exerted vertically against a bottom uniform face 915 of the riveting section 913, the force can be easily transferred to the rotating section 912, which can result in radial deformation of the rotating section 912, and thus an increase in friction between the rotating section 912 and the base 7. This flaw is also found in the copending U.S. application Ser. No. 10/108,124 which has the same assignee with the invention and is an improvement to the conventional ZIF socket for another consideration.

Hence, a ZIF socket having an improved cam mechanism is required.

SUMMARY OF INVENTION

Accordingly, the object of the present invention is to fprovide a ZIF socket with an improved cam mechanism which is more likely to operate smoothly following assembly.

To achieve the above-mentioned object, a ZIF socket in accordance with the present invention includes an insulating base having a plurality of terminals therein, a cover slideably movable on the base, and a cam mechanism securely assembled on the base and the cover. The cam mechanism includes a cam and a base ring. The cam has a driving section engagable with the cover, a rotating section engagable with the base and extending from the driving section, and a riveting section extending from the rotating section. An axis of the rotating section is offset from that of the driving section a predetermined distance. The base ring attaches to the riveting section. The riveting section has a bottom riveting surface at a bottommost side thereof and a V-shaped groove defined in the bottom riveting surface. The V-shaped groove provides a more controlled deformation of the riveting section, under less riveting pressure, so avoids transfer of large riveting forces to the rotating section.

Other objects, advantages and novel features of the invention will become more apparent from the following detailed description of the present embodiment when taken in conjunction with the accompanying drawings.

DETAILED DESCRIPTION

Figure 1:
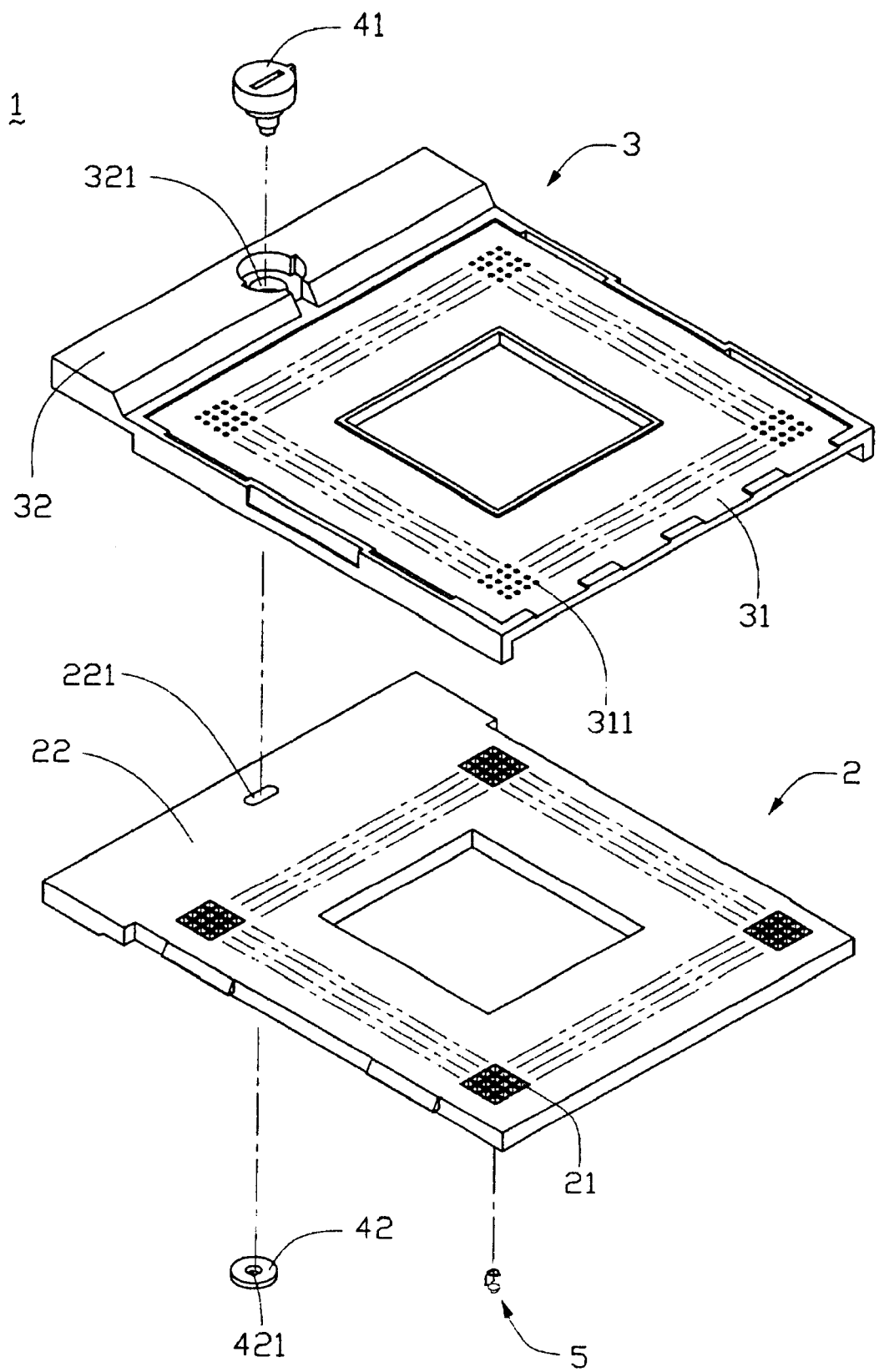
FIG. 1 is an exploded, perspective view of a ZIF socket in accordance with the present invention.

Reference will now be made to the drawing figures to describe the present invention in detail.

Referring to FIG. 1, a ZIF socket 1 in accordance with the present invention is adapted for connecting a CPU (not shown) and a printed circuit board (not shown), comprises an insulating base 2 having a plurality of terminals 5 (only one shown) received therein, a cover 3 slideably attached on the insulating base 2, and a cam mechanism 4 secured on the insulating base 2 and the cover 3.

The insulating base 2 is configured as a rectangular plate and defines an aperture 221 in a middle of a front end 22 thereof. A plurality of passageways 21 is defined in the insulating base 2 for receiving corresponding terminals 5 therein.

The cover 3 has a main portion 31 and a head portion 32 extending forwardly from a front edge of the main portion 31. A cam receiving hole 321 is defined through the head portion 32 for receiving the cam mechanism rotatably therein. A plurality of through-holes 311 is defined in the main portion 31.

Figure 2A:
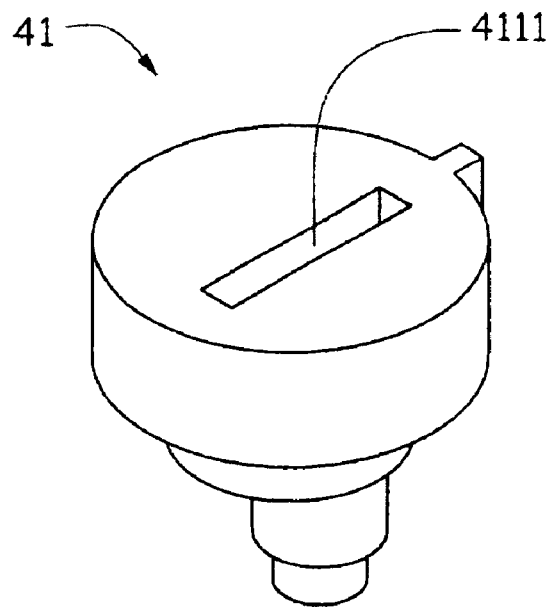
FIG. 2A is a perspective view of a cam of the ZIF socket shown in FIG. 1.
Figure 2B:
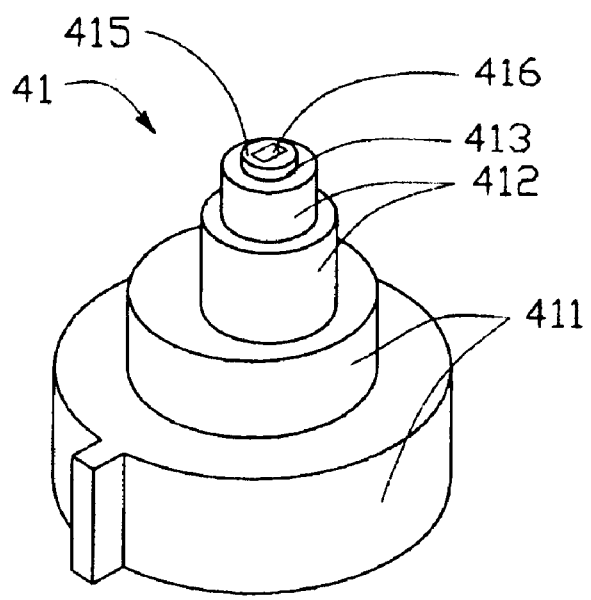
FIG. 2B is an upside-down perspective view of the cam shown in FIG. 2A

The cam mechanism 4 comprises a cam 41 and a base ring 42 assembled to a bottom side of the cam 410. In a preferred embodiment, the base ring 42 is made of metal material. Particularly referring to FIGS. 2A and 2B, the cam 41 includes a two element driving section 411, the larger element being rotatably received in the cam receiving hole 321, a two element rotating section 412 extending straight downwardly from a bottom side of the driving section 411, and a riveting section 413 extending downwardly from a bottom of the rotating section 412. An axis of the rotating section 412 is offset a predetermined distance from an axis of the driving section 411. The diameters of both elements of the rotating section 412 are less than the diameters of both elements of the driving section 411. The driving section 411 defines an operating recess 4111 access a center of a top face thereof for receiving an external tool (not shown), such as a screwdriver, to provide the cam 41 with a rotating force. The riveting section 413 has a bottom riveting surface 415 at a bottommost side and a V-shaped groove 416 defined in the bottom riveting surface 415 and extending parallel to the operating recess 4111 of the driving section 411. The base ring 42 is configured as a flat annulus with a hole 421 defined therethrough. The riveting section 413 is received in the hole 421 and is riveted on a bottom side of the base ring 42.

Figure 3:
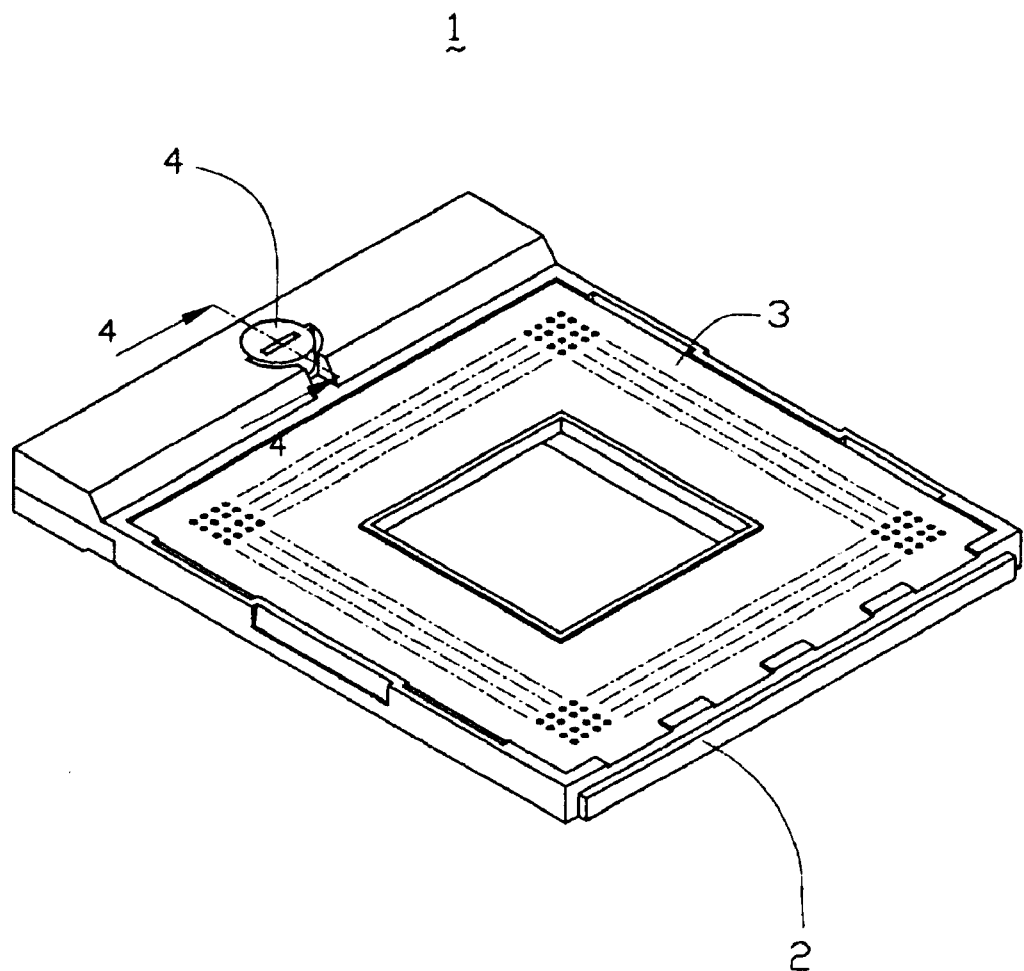
FIG. 3 is an assembled, perspective view of the ZIF socket shown in FIG. 1.
Figure 4:
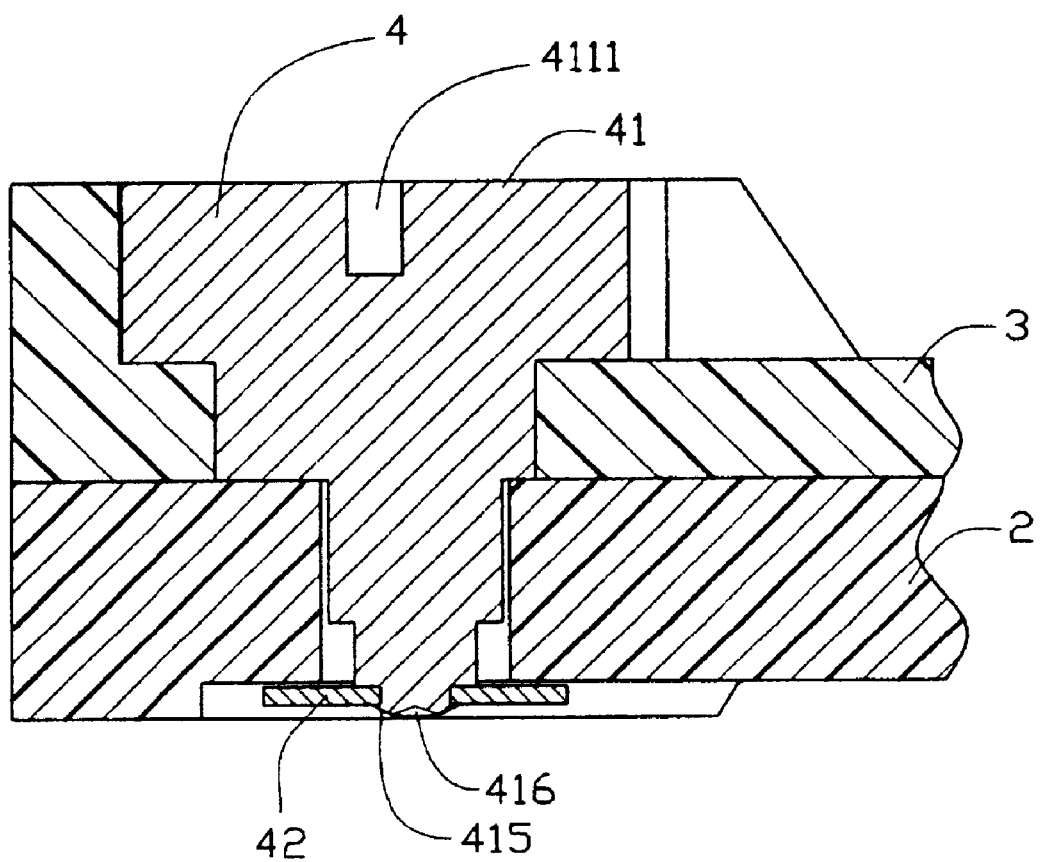
FIG. 4 is a cross-sectional view of the ZIF socket shown in FIG. 3 taken along line 4.
Figure 5:
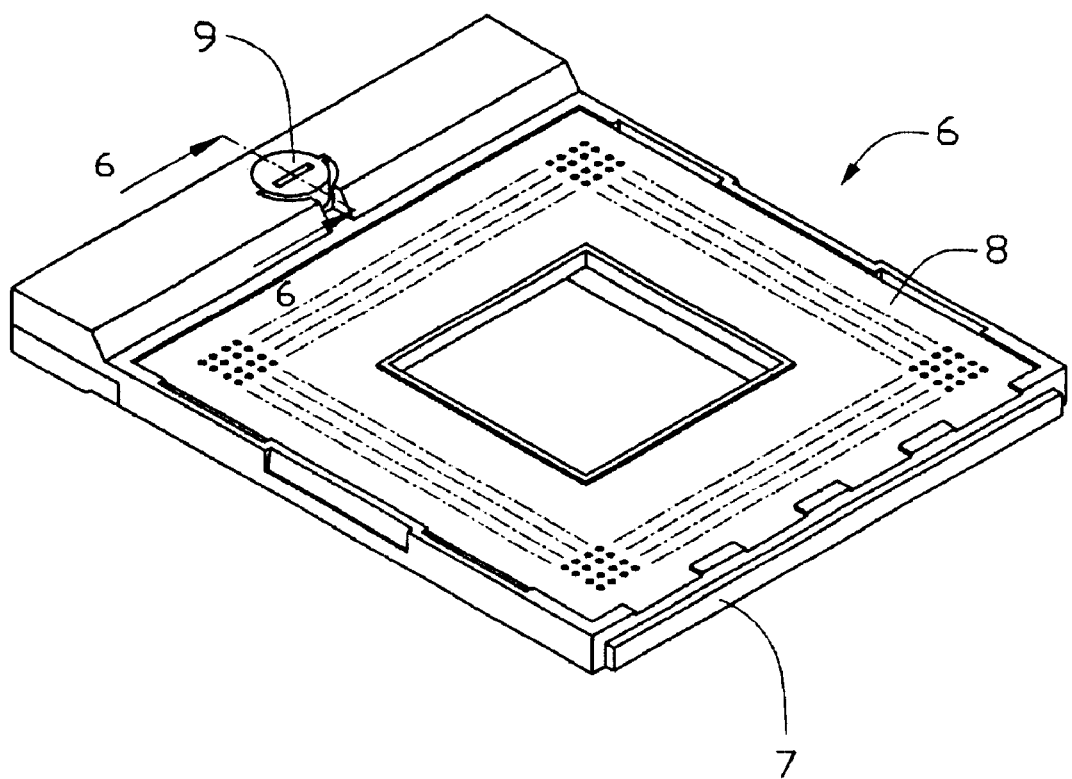
FIG. 5 is an assembled, perspective view of a conventional ZIF socket.
Figure 6:
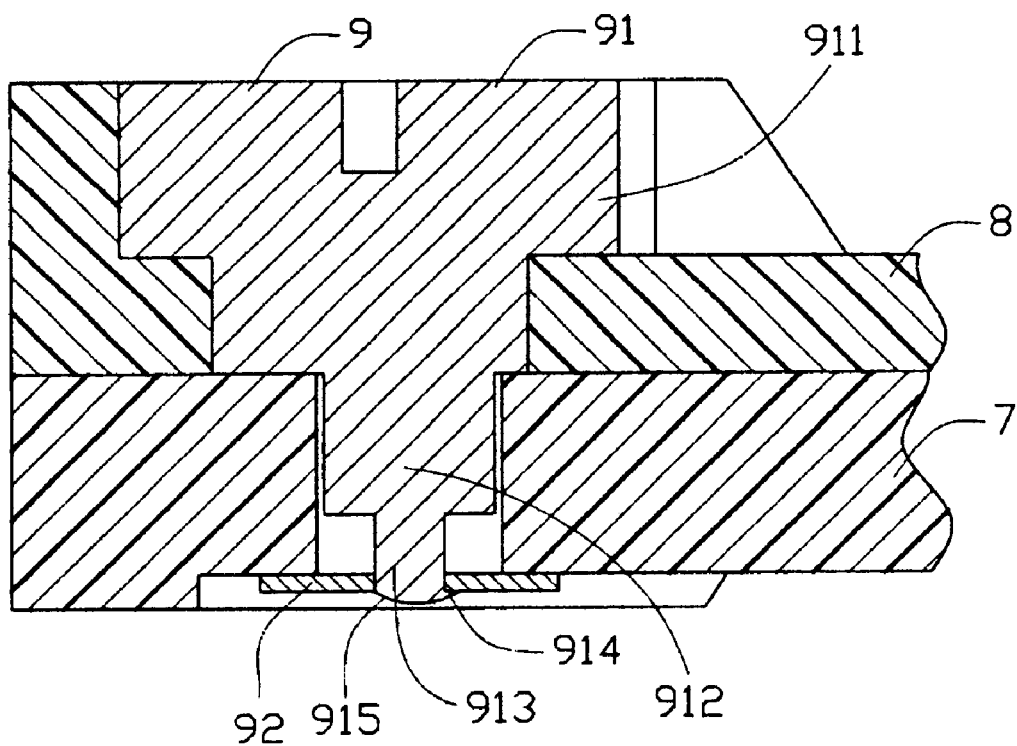
FIG. 6 is a cross-sectional view of the ZIF socket shown in FIG. 5 taken along line 6—6.

In assembly, as shown in FIG. 3, the cover 3 is assembled on the insulating base 2 with the cam receiving hole 321 aligning with the aperture 221 of the insulating base 2 and communicating therewith, and the plurality of through-holes 311 aligning with the plurality of passageways 21 and in communication therewith. The cam 41 is then inserted into and received in the cam receiving hole 321, with the rotating section 412 being retained in the aperture 221 of the insulating base 2. The base ring 42 is fit on the end of the cam 41 with the riveting section 413 extending through the hole 421 of the base ring 42. Finally, the riveting section 413 is riveted onto the bottom side of the base ring 42. Terminals 5 are positioned in the passageways 21 of the base 2 and can be soldered to the printed circuit board, and pins of the CPU can be extended through the through-holes 311 to electrically connect to the terminals 5.

Compared with the prior art, during riveting of the riveting section 413 onto the base ring 42, the deformation of the bottom riveting surface 415 under a riveting pressure is more controlled, and deforms symmetrically to either side of the V-shaped groove 416. Therefore, a smaller riveting force can firmly secure the base ring 42 to the cam 41. Furthermore, the smaller riveting force avoids a large force being transferred to the rotating section 412 through the riveting section 413, and therefore a deformation of the rotating section 412 is less likely, and the resulting production of friction between the rotating section 412 and peripheral sidewalls of the aperture 221 of the insulting base 2 is therefore avoided.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket comprising: an insulating base having a plurality of terminals received therein, said insulating base defining an aperture therein; a cover slidably mounted on said insulating base, said cover having a receiving hole defined therein, said receiving hole being alignable with the aperture of the insulating base; and a cam mechanism comprising a cam and a base ring cooperating with the cam, the cam having a driving section engageably received in the receiving hole, a rotating section extending from the driving section and engageably received in the aperture, and a riveting section extending from the rotating section and riveted against the base ring, said riveting section having a bottom surface and a groove defined in the bottom surface; wherein said groove of the cam is configured in a shallow V-shape and placed at a center of the bottom surface of said riveting section, such that outer periphery of the riveting section has continuous bottom surface.

2. The ZIF socket as described in claim 1, wherein an axis of said rotating section is offset from that of said driving section a predetermined distance.

3. The ZIF socket as described in claim 1, wherein said cam defines an operating recess in a top surface of the driving section, which is generally parallel to said V-shaped groove for rotating the cam via a tool.

4. The ZIF socket as described in claim 1, wherein said cover forms a head portion and said receiving hole is defined in said head portion.

5. The ZIF socket as described in claim 4, wherein said aperture is defined at a front end of said insulating base.

* * * * *